United States Patent [19]

Davidson

[11] Patent Number: 5,079,619

[45] Date of Patent: Jan. 7, 1992

[54] APPARATUS FOR COOLING COMPACT ARRAYS OF ELECTRONIC CIRCUITRY

[75] Inventor: Howard L. Davidson, San Carlos, Calif.

[73] Assignee: Sun Microsystems, Inc., Mountain View, Calif.

[21] Appl. No.: 553,541

[22] Filed: Jul. 13, 1990

[51] Int. Cl.$^5$ ............................................. H01L 23/02
[52] U.S. Cl. ..................................... 357/81; 361/381; 361/385; 174/252
[58] Field of Search ................... 357/81, 82; 361/381, 361/388, 397, 385; 174/252

[56] References Cited

U.S. PATENT DOCUMENTS

| | | | |
|---|---|---|---|
| 3,766,439 | 10/1973 | Isaacson | 174/252 |
| 4,368,503 | 1/1983 | Kurosawa | 361/382 |
| 4,631,573 | 12/1986 | Sutrina | 357/81 |
| 4,729,061 | 3/1988 | Brown | 357/81 |
| 5,005,640 | 4/1991 | Lapinski et al. | 361/385 |

*Primary Examiner*—Eugene R. LaRoche
*Assistant Examiner*—R. Ratliff
*Attorney, Agent, or Firm*—Blakely, Sokoloff, Taylor & Zafman

[57] ABSTRACT

In an arrangement for packaging planar arrays of circuit components including a plurality of essentially parallel layers in which the layers lie closely adjacent one another, one or more of the layers including a substrate of insulating material having circuit board apparatus imbedded therein, the improvement including apparatus positioned against at least one of the layers for removing heat from the arrangement.

11 Claims, 2 Drawing Sheets

APPARATUS FOR COOLING COMPACT ARRAYS OF ELECTRONIC CIRCUITRY

BACKGROUND OF THE INVENTION

1. Field of the Invention

This invention relates to computer systems and, more particularly, to apparatus for cooling very high density systems of hybrid electronic circuits used in computer systems.

2. History of the Prior Art

The semiconductor and other devices utilized in modern computer systems function correctly only when operating within specified temperature ranges. In general, the components are designed to operate reliably within a relatively narrow range which may extend to about 100 degrees C. at the upper limit. Above this point, the devices themselves are unreliable in handling digital information and may well be destroyed as the temperature rises. Typically desktop computer systems such as personal computers and work stations include a motherboard upon which are positioned a central processing unit, memory, and input/output circuitry connected to a system bus. Slot connections are provided to the system bus on the motherboard for system peripheral components. Ambient air driven often driven by small fans installed within the cases of the computers cool the electronic circuitry to appropriate operating temperatures.

An entirely different packaging arrangement which is the subject of copending patent application Ser. No. 07/553,521, entitled Three Dimensional Packaging Arrangement for Computer Systems and the Like, filed July 13, 1989, on even date herewith, H. Davidson, allows an entire computer with 0.5 gigabytes of random access storage and as many as four individual processors to be contained in a volume approximately four inches on a side and one inch thick. Such a compact arrangement is obtained by allowing very thin layers of hybrid circuits to be essentially placed against one another to form a total computer package. Such a powerful computer is capable of operating at faster speeds than are conventionally packaged computers because of the short lengths of the conductors used. However, the higher packing densities have tended to raise the temperature to a level which normal cooling devices cannot handle.

In order to obtain very fast operating speeds from such a computer, very high speed devices may be used in the embedded chips. These devices require a great deal of power and operate to produce very high temperatures. With such a system, as much as two hundred amps of current may be utilized at each layer, producing as much as 1000 watts of power at each of a number of the layers of the arrangement. Prior art cooling techniques will simply not keep a computer of this sort within the operating temperature limits of its electronic devices, and the apparatus will destroy itself within a very short time after power is applied.

SUMMARY OF THE INVENTION

It is, therefore, an object of the present invention to provide an arrangement for cooling a very densely packed computer system.

It is another, more general, object of the present invention to provide an arrangement for cooling a very densely packed system composed of thin planes of circuitry laid side by side abutting one another.

It is another more particular object of the present invention to provide an arrangement for cooling a very densely packed high speed computer system composed of planes of circuitry laid side by side, certain of which planes generate very high operating temperatures.

These and other objects of the present invention are realized in an arrangement for packaging thin planar arrays of circuit components including a plurality of essentially thin parallel layers in which the layers lie closely adjacent one another, one or more of the layers comprising a substrate of insulating material having circuit board means imbedded therein, the improvement comprising heat-conducting means positioned against at least one of the layers for removing heat from the arrangement, the heat-conducting means having an interior channel for transferring an inert fluid to accomplish the heat removal.

These and other objects and features of the invention will be better understood by reference to the detailed description which follows taken together with the drawings in which like elements are referred to by like designations throughout the several views.

DETAILED DESCRIPTION OF THE INVENTION

Figure 1:
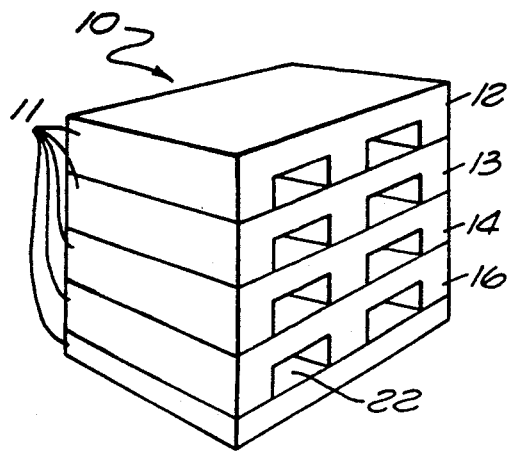
FIG. 1 is an isometric diagram illustrating a densely packed computer packaging design described in a copending patent application.

Referring now to FIG. 1, there is illustrated an isometric view of a packaging arrangement disclosed in copending U.S. patent application Ser. No. 07/553,521, entitled Three Dimensional Packaging Arrangement of Computer Systems and the Like, filed July 13, 1989, on even date herewith, H. Davidson. The packaging arrangement includes a plurality of individual layers of circuit elements each of which, in general, is comprised of integrated circuits which may together form one of a number of different components of larger systems. For example, a first layer 12 may be a central processor for a computer, a second layer 13 and a third layer 14 may both be random access memory for the computer, and a fourth layer 16 may consist of input/output circuitry for the computer. As explained in the above-mentioned patent application, each of the layers comprises integrated circuits embedded in an insulating substrate. The layers are all constructed to have opposing major surfaces, in general, parallel to one another so that a plurality of the layers may be placed together and joined to form a very densely packed system.

Each of the planar layers 11 of the arrangement 10 may be constructed using any technology which is capable of providing flat and parallel top and bottom surfaces. A presently preferred technology uses a single flat sheet of ceramic material as a substrate into which are carved recesses for receiving integrated circuit chips. The chips and the pocketed substrate layer are covered on one side with very thin flat layers of high temperature plastic material each of which has holes through it to allow connections to be made directly to the chips lying in the pockets. Connectors are placed in the holes and an interconnect pattern described on the individual layers of plastic material to form a multilayer interconnect. Conductive pads may be placed on the upper one of the plastic layers. The conductors of the interconnect are joined to conductors which form busing paths passing through the substrate. In a preferred embodiment, the substrate is placed in an insulating shell 17. The shell 17 has rails 19 in which are embedded conductors 20 for continuing the busing between the layers 11. Using the technology described in the copending patent application, individual layers of less than 0.050 inches in thickness are produced.

In this manner, as many as sixteen processors or, alternatively, 0.5 gigabytes of random access memory may be arranged as described and occupy a volume of approximately four inches on a side by one inch thick. Those skilled in the art will recognize that by combining these components, a pocket-sized supercomputer may be constructed.

This packaging arrangement offers a number of advantages in addition to its small size. It provides substantially more access to the embedded chips than in the usual connector arrangement of the prior art in which a chip has connector terminals only around its periphery. The length of the conductors which function as computer buses is extremely short providing very low impedance and, consequently, minimal access times. Exemplary values of 0.5 nanohenries of inductance per connector, a few milliohms of resistance, and 5 picofarads of capacitance are to be expected. Such short conductors cut down the time to access circuit elements to an insignificant fraction of the time required in prior art computers.

As is illustrated in the FIG. 1, a number of slots 22 are cut through the shells holding the individual layers of the arrangement 10 to provide for the circulation of air therethrough so that the entire arrangement may be cooled. This cooling arrangement suffices where the system is a relatively commonplace computer. However, in order to provide the abilities of a supercomputer, very fast components are desirable. Some of these components require a great deal of power and generate a great deal of heat in operation. Thus, though computers using a very large number of devices may be constructed using this packaging technique and cooled using conventional airflow/fan techniques, high speed components may generate so much heat in operation that their association in such an arrangement would destroy the elements of the circuits in very short time.

Figure 2:
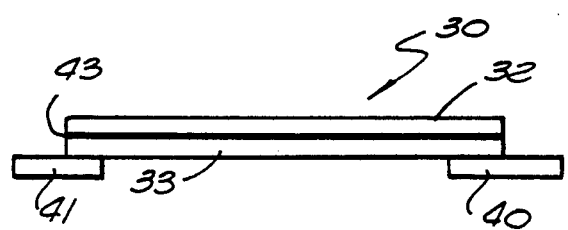
FIG. 2 is a side view of a single heat exchanger constructed in accordance with the invention.
Figure 3:
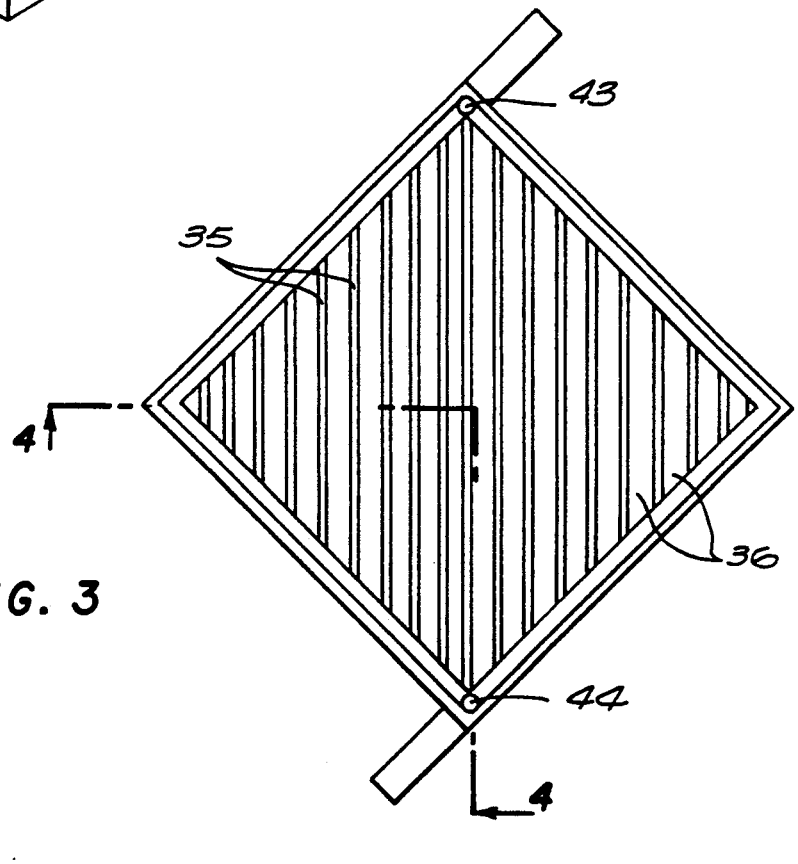
FIG. 3 is a top view of a single heat exchanger constructed in accordance with the invention.
Figure 4:
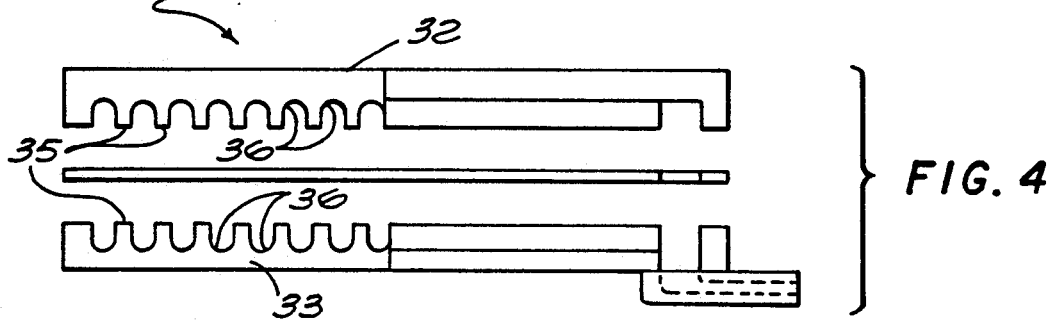
FIG. 4 is a cross-sectional view of the heat exchanger of this invention.
Figure 5:
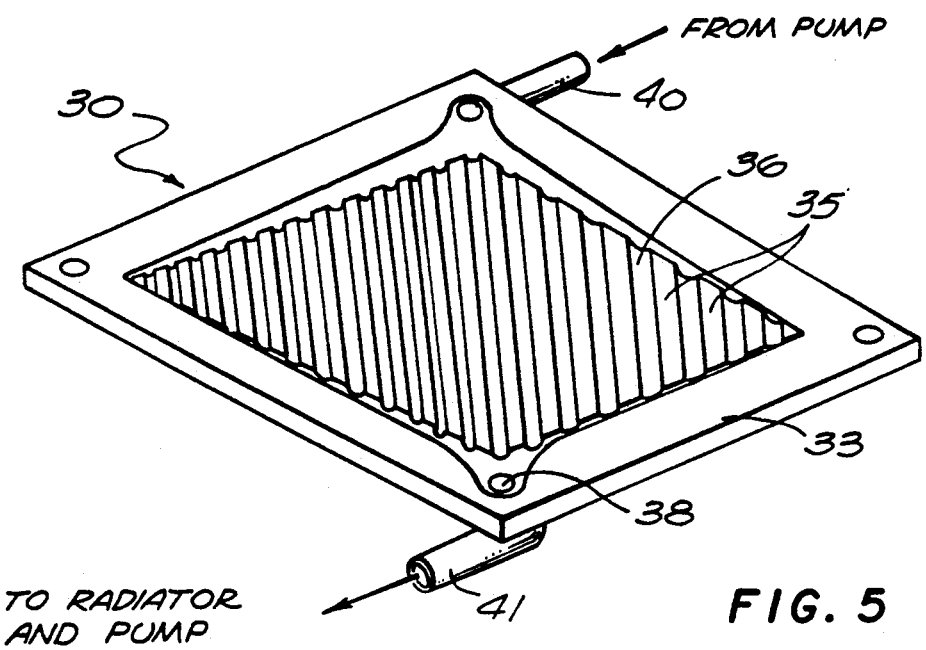
FIG. 5 is an isometric view of a portion of the heat exchanger illustrated in FIGS. 2, 3, and 4.

In order to remove the heat from the arrangement 10 in such higher power uses, a novel arrangements of heat exchange units has been devised. A single unit 30 which might be used to cool a single isolated layer of electronic circuitry is illustrated in side, top, and cross-sectional views in FIGS. 2, 3, and 4 in order to show the details of construction of such a unit. It should be understood that such a unit is not intended to fit the arrangement 10. An isometric view of a portion of one of the heat exchange units 30 is illustrated in FIG. 5. A unit 30 may be constructed of a metal such as copper which provides efficient heat transfer. An exemplary heat exchanger 30 may have overall dimensions of approximately four inches by four inches by 0.050 inches when used with a single substrate layer of approximately the same size. When used with a single layer of electronic components, a heat exchanger 30 would lie with one broad flat side abutted against one or the other of the sides of the layer holding the hybrid chip. When shaped so that they may be placed within the slots 22 formed in the shell (see 11 in FIG. 1) of the arrangement 10 of FIG. 1 for providing air cooling, the heat exchangers 30 would be of different dimensions (to fit within the slots 22) but would lie with one broad flat side abutted against a thin layer of ceramic upon which a hybrid chip is placed and on the other side against an insulating layer covering the multi-layer interconnect to the upper surface of a chip.

The heat exchanger 30 preferably is constructed of a top plate 32 and a bottom plate 33. The heat exchanger 30 preferably utilizes an inner conduit which provides for parallel transfer of fluids used to remove the heat from the circuitry in the layers 11. This conduit may be formed by etching the individual top and bottom plates 32 and 33 of which the heat exchanger 30 is formed. The etching provides upstanding ridges 35 which separate grooves 36 to form the conduit from an opening 37 to a second opening 38. Fluids are injected into the heat exchanger 30 at the first opening 37, traverse the conduit, and are removed from the heat exchanger 30 at the second opening 38. Copper pipes 40 and 41 may be joined to the openings 37 and 38 for providing fluid access thereto. A pump and heat disposal arrangement such as a refrigerating device (not shown in the figures) may be connected in the fluid line to the pipes 40 and 41 to move fluid through the heat exchangers 30 and remove the heat from the fluid.

Using such a heat exchanger 30, it has been found that a single layer of circuitry consuming more than 500 watts of power may be cooled to approximately 47 degrees C. at the surface of the heat exchanger 30.

FIG. 5 illustrates the interior of one side (the bottom 33) of a heat exchanger 30 constructed in accordance with the invention. As may be seen, the interior provides a conduit around a number of upstanding projections 35 for directing a fluid to flow in a long path through the grooves 36 past the surfaces of the heat exchanger 30. The heat exchanger 30 may be constructed in two halves of copper sheet each of which is chemically etched on one side to provide the projections 35 so that when the halves are clamped together in the arrangement 10 the interior conduit path is provided. The heat exchangers 30 may be assembled and removed in the field with the other elements of the arrangement 10. In an alternative embodiment, a thin layer of copper material 43 (see FIG. 2) may be inserted to form a plenum between the top and bottom 32 and 33 to separate those halves and provide additional cooling. Holes for allowing fluid transfer between the top and bottom 32 and 33 would be required in such a case.

Figure 6:
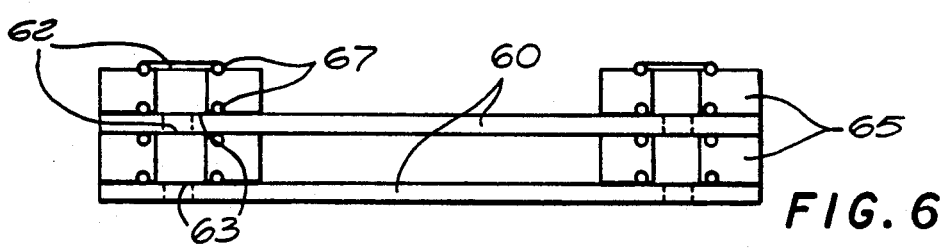
FIGS. 6 and 7 illustrate another embodiment of the invention in which a plurality of heat exchangers are joined together.
Figure 7:
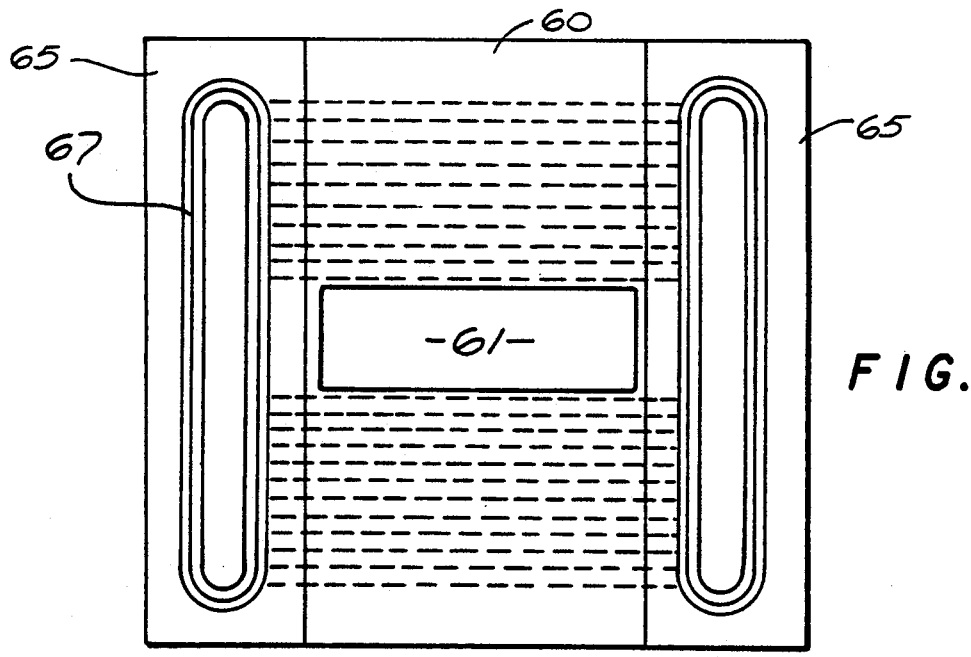

FIGS. 6 and 7 illustrate another embodiment of the invention in which a plurality of heat exchangers 60 are joined together to cool an entire arrangement 10. The individual heat exchangers 60 which are generally constructed in the manner illustrated in FIGS. 3, 4 and 5, each have an opening 61 adapted to fit around the center depending portion of the shell 17 so that the heat exchangers 60 lie against both adjoining layers within the slots 22. The individual heat exchangers 60 each have an opening 62 at each end of a projecting upper surface and an opening 63 in a lower surface. The openings of adjoining heat exchangers 60 are designed to abut the surface of a carrier sheet 65 which has an opening therein of essentially the same size as the openings 62 and 63. Each surface of the carrier sheet is grooved to hold an O ring 67 around each opening in the carrier sheet 65. Thus when the heat exchangers 60 and carrier sheets 65 are clamped together with the layers 11 in the slots 22 as the arrangement 10 is formed, each opening 62 and 63 is forced tightly against the opening in one of the carrier sheets 65 so that a manifold is formed which joins the interior of the heat exchangers 60 together. This arrangement allows coolant to be transferred in parallel to each layer to make more efficient use of the heat exchangers 60. The ends of heat exchangers 60 at the top and bottom of the arrangement 10 may then be connected into a heat exchange path with a pump and heat removal device in the manner illustrated in FIG. 4.

Figure 8:
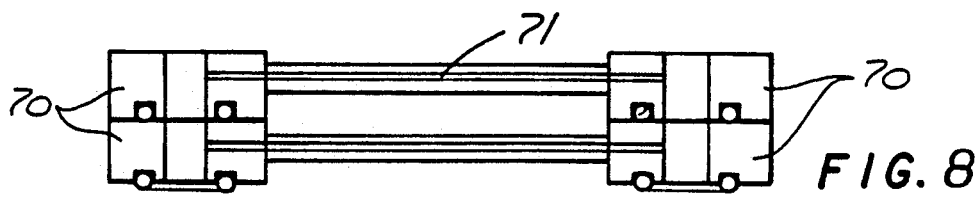
FIG. 8 illustrates a similar arrangement to that illustrated in FIGS. 6 and 7.

FIG. 8 illustrates a similar arrangement to that illustrated in FIGS. 6 and 7. The arrangement utilizes individual stacked manifold blocks 70 into which the cooling fluid passages 71 are routed.

In order to provide for the efficient transfer of heat from layers 11 of circuitry to the cooling layers, it may be advisable to increase the thermal contact by use of materials which enhance the transfer. For example, soldering, brazing, direct bonding, thermally-conductive adhesives and elastomer sheets, flexible graphite sheets, soft metals such as indium, foils, and thermally conductive greases may all be used to enhance the thermal transfer. When used on the side of the electronic layers which has a plastic coating those methods other than soldering, brazing, and direct bonding should be used.

Thus the present invention has disclosed an arrangement for removing large amounts of heat from densely packed electronic systems. Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. In an arrangement for packaging planar arrays of circuit components comprising a plurality of essentially parallel layers in which the layers lie closely adjacent one another, one or more of the layers comprising a substrate of insulating material having circuit board means imbedded therein, the improvement comprises:
a first means and a second means; each of said first and second means positioned against at least one of the layers for removing heat from the arrangement; each of said first and second means comprising at least one heat exchanger abutted against one of the layers, and means for transferring an inert fluid through a plurality of paths in said heat exchanger; each of said plurality of paths formed by upstanding ridges in opposing interior surfaces of said heat exchanger;
means for joining the interior fluid paths of said first and second means together.

2. The arrangement as set forth in claim 1, wherein each of said first and second means for removing heat from the arrangement further comprises:
means for removing heat from said inert fluid passing through said plurality of paths in each heat exchanger.

3. The arrangement as set forth in claim 1, wherein the means for joining the interior fluid paths comprises an opening in each heat exchanger, and fluid conducting means adapted to mate with an opening in a pair of adjacent heat exchangers.

4. In an arrangement as claimed in claim 3, each of said heat exchanger being devised to fit in slots provided in the arrangement.

5. An arrangement of circuit components comprising a plurality of essentially parallel layers in which the layers lie closely adjacent one another, one or more of the layers comprising a substrate of insulating material having circuit board means imbedded therein, another of the layers comprising:
cooling means positioned against at least one of the layers comprising a substrate of insulating material having circuit board means imbedded therein for removing heat from the arrangement, said means comprising at least two heat exchangers; each of said heat exchangers abutted against one of the layers, and means for transferring an inert fluid through a plurality of paths in each of said heat exchangers, each of said plurality of paths comprising upstanding ridges in opposing interior surfaces of each of said heat exchangers, and
means for joining the interior fluid paths of at least two adjacent heat exchangers together.

6. The arrangement of circuit components as set forth in claim 5 in which the cooling means further comprises:
means for removing heat form said inert fluid passing through said plurality of paths in each of said heat exchangers.

7. The arrangement of circuit components as set forth in claim 5, wherein the means for joining the interior fluid paths comprises an opening in each heat exchanger, and fluid conducting means adapted to mate with an opening in a pair of adjacent heat exchangers.

8. An arrangement of circuit components as claimed in claim 7, in which each of said heat exchanger is devised to fit in slots provided in the arrangement.

9. A method for manufacturing and packaging planar arrays of circuit components comprising a plurality of essentially parallel layers in which the layers lie closely adjacent one another, one or more of the layers comprising a substrate of insulating material having circuit board means imbedded therein, comprising the additional steps of:
providing a first means for removing heat from the arrangement comprising at least two heat exchangers; each of said heat exchangers abutted against one of the layers,
chemically etching a plurality of upstanding ridges in opposing interior surfaces of each of said heat exchangers,
forming a plurality of paths by clamping the opposing interior surfaces of each of said heat exchangers together,
providing means for joining the interior fluid paths of a pair of adjacent heat exchangers together,
transferring an inert fluid through said plurality of paths in each of said heat exchangers.

10. The method as set forth in claim 9, wherein the step of providing the means for removing heat from the arrangement further comprising the steps of:

providing means for removing heat from said inert fluid passing through said plurality of paths in each of said heat exchangers, devising each of said heat exchangers to fit in slots provided in the arrangement.

11. An arrangement of circuit components comprising a plurality of essentially parallel layers in which the layers lie closely adjacent one another, one or more of the layers comprising a substrate of insulating material having circuit board means imbedded therein, another of the layers comprising:

a first and a second cooling means; each of said first and second cooling means positioned against at least one of the layers comprising a substrate of insulating material having circuit board means imbedded therein for removing heat from the arrangement, each of said first and second cooling means further comprising means for transferring an inert fluid through a plurality of paths in said heat exchanger, said plurality of paths comprising upstanding ridges in opposing interior surfaces of said heat exchanger, at least one of said first and second cooling means comprising at least one heat exchanger devised to fit in slots provided in the arrangement, means for joining the interior fluid paths of said first and second means together, means for removing heat from said inert fluid passing through said plurality of paths in each of said heat exchangers.

* * * * *